(12) United States Patent
Omura et al.

(10) Patent No.: US 7,745,981 B2
(45) Date of Patent: Jun. 29, 2010

(54) PIEZOELECTRIC ACTUATOR AND METHOD FOR MANUFACTURING PIEZOELECTRIC ACTUATOR

(75) Inventors: Shinji Omura, Omihachiman (JP); Koichi Hayashi, Kusatsu (JP); Shozo Kobayashi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/372,114

(22) Filed: Feb. 17, 2009

(65) Prior Publication Data
US 2009/0152999 A1 Jun. 18, 2009

Related U.S. Application Data

(60) Division of application No. 11/610,065, filed on Dec. 13, 2006, now Pat. No. 7,509,716, which is a continuation of application No. PCT/JP2005/018920, filed on Oct. 14, 2005.

(30) Foreign Application Priority Data
Jan. 6, 2005 (JP) ............................. 2005-001679

(51) Int. Cl.
*H01L 41/083* (2006.01)
(52) U.S. Cl. ...................................... 310/366; 310/328
(58) Field of Classification Search ................. 310/328, 310/366
See application file for complete search history.

(56) References Cited

U.S. PATENT DOCUMENTS

| | | | | |
|---|---|---|---|---|
| 4,633,120 A | * | 12/1986 | Sato et al. | 310/328 |
| 5,266,862 A | * | 11/1993 | Ohya | 310/328 |
| 6,274,966 B1 | * | 8/2001 | Kohno et al. | 310/328 |
| 6,291,929 B1 | * | 9/2001 | Heinz et al. | 310/328 |
| 6,437,488 B1 | | 8/2002 | Sube et al. | |
| 6,787,975 B2 | | 9/2004 | Kobayashi et al. | |
| 7,042,143 B2 | * | 5/2006 | Bindig et al. | 310/366 |
| 7,067,960 B2 | * | 6/2006 | Kobayashi et al. | 310/328 |
| 7,402,143 B2 | * | 7/2008 | Berger et al. | 600/595 |
| 7,402,937 B2 | * | 7/2008 | Sugg | 310/358 |
| 7,509,716 B2 | * | 3/2009 | Omura et al. | 29/25.35 |

(Continued)

OTHER PUBLICATIONS

Omura et al.; "Piezoelectric Actuator and Method for Manufacturing Piezoelectric Actuator"; U.S. Appl. No. 11/610,065, filed Dec. 13, 2006.

(Continued)

*Primary Examiner*—Thomas M Dougherty
(74) *Attorney, Agent, or Firm*—Keating & Bennett, LLP (57) ABSTRACT

In a method for manufacturing a piezoelectric actuator, a ceramic sintered body is prepared and a size of the ceramic sintered body is adjusted in a thickness direction defined below by grinding piezoelectric ceramic layers, included in the ceramic sintered body, located outermost in the thickness direction. In the ceramic sintered body, internal electrodes are each disposed between piezoelectric ceramic layers. The thickness direction is defined as the direction along the thickness of the piezoelectric ceramic layer. Each of the inert sections are disposed on at least one side of the active section, for driving the piezoelectric actuator, in the thickness direction. Dummy internal electrodes are arranged in the inert sections such that each of the dummy internal electrodes are each located between ceramic layers. The thickness of the piezoelectric ceramic layers disposed between the dummy internal electrodes increases with distance from the active section.

8 Claims, 4 Drawing Sheets

U.S. PATENT DOCUMENTS

| | | | | |
|---|---|---|---|---|
| 7,545,080 B2 * | 6/2009 | Kastl et al. | .................. | 310/328 |
| 7,633,210 B2 * | 12/2009 | Ono et al. | ................... | 310/328 |
| 2002/0084723 A1 * | 7/2002 | Kawazoe | .................... | 310/348 |
| 2002/0149297 A1 * | 10/2002 | Yamamoto et al. | .......... | 310/328 |

OTHER PUBLICATIONS

Official Communication issued in corresponding German Patent Application No. 11 2005 001 022.8, mailed on Feb. 19, 2010.

* cited by examiner

PIEZOELECTRIC ACTUATOR AND METHOD FOR MANUFACTURING PIEZOELECTRIC ACTUATOR

BACKGROUND OF THE INVENTION

1. Field of the Invention

The present invention relates to monolithic piezoelectric actuators including piezoelectric ceramics and methods for manufacturing such piezoelectric actuators. The present invention particularly relates to a piezoelectric actuator including an active section and inert sections including dummy internal electrodes, and also relates to a method for manufacturing such a piezoelectric actuator, the active section being disposed between the inert sections and distorted by the application of an electric field.

2. Description of the Related Art

Piezoelectric actuators have been used to move magnetic heads or print heads for inkjet printers. The following actuator has been proposed: a monolithic piezoelectric actuator that is prepared by an internal electrode-ceramic co-firing process so as to have a small size.

Figure 4:
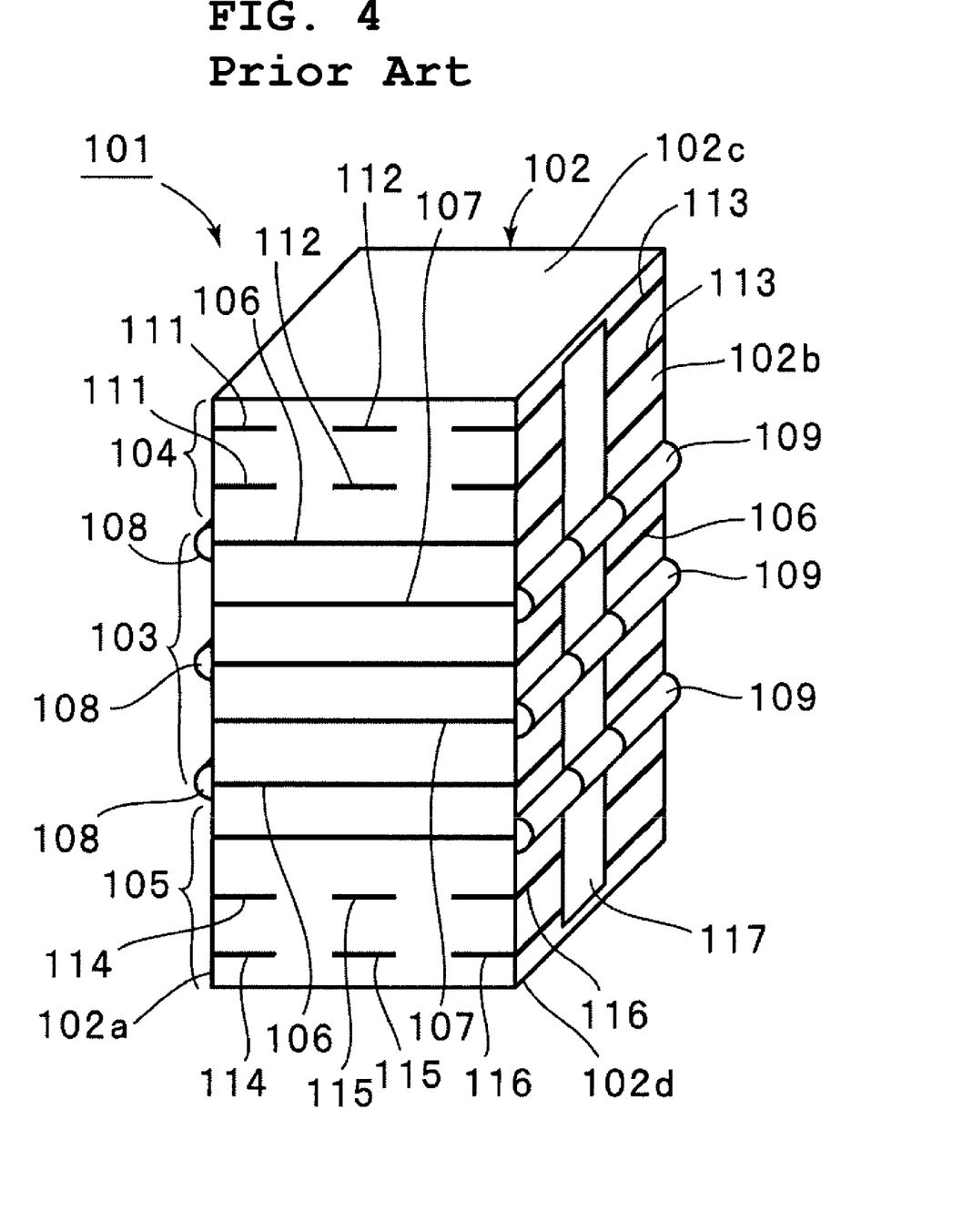
FIG. 4 is a perspective view of an example of a conventional monolithic piezoelectric actuator.

Japanese Unexamined Patent Application Publication No. 2001-352110 (Patent Document 1) below discloses an exemplary monolithic piezoelectric actuator. FIG. 4 is a perspective view of the piezoelectric actuator disclosed in Patent Document 1.

The piezoelectric actuator 101 includes a ceramic sintered body 102 made of a piezoelectric ceramic. The ceramic sintered body 102 is prepared by an internal electrode-ceramic co-firing process. In the descriptions below, the direction along the thickness of each piezoelectric ceramic layer sandwiched between internal electrodes is defined as a thickness direction. In the ceramic sintered body 102, an active section 103 is located at the approximate center of the ceramic sintered body 102 and inert sections 104 and 105 are located at both sides thereof in the thickness direction.

In the active section 103, a plurality of first internal electrodes 106 and second internal electrodes 107 are alternately arranged in the thickness direction with each piezoelectric ceramic layer disposed therebetween. The first and second internal electrodes 106 and 107 extend perpendicularly to the thickness direction of the ceramic sintered body 102.

The ceramic sintered body 102 has a first side surface 102a and includes insulating layers 108 extending on the first side surface 102a in a lateral direction perpendicular to the thickness direction. The insulating layers 108 cover portions of the first internal electrodes 106 that are exposed at the first side surface 102a. Furthermore, the ceramic sintered body 102 has a second side surface 102b opposed to the side surface 102a and includes insulating layers 109 extending on the second side surface 102b. The insulating layers 109 cover portions of the second internal electrodes 107 that are exposed at the second side surface 102b.

In the inert section 104, three dummy internal electrodes 111 to 113 are arranged in a striped pattern in the same level. Dummy internal electrode groups each including the three dummy internal electrodes 111 to 113 are disposed between ceramic layers. In the inert section 105 and the inert section 104, a plurality of other dummy internal electrode groups each including dummy internal electrodes 114 to 116 are disposed between ceramic layers.

The dummy internal electrodes 111 to 113 have a stripe shape and are electrically isolated from each other. The dummy internal electrodes 114 to 116 also have a stripe shape and are electrically isolated from each other.

An external electrode 117 extends vertically on the second side surface 102b of the ceramic sintered body 102. In the active section 103, the external electrode 117 is connected to the internal electrodes 106 exposed at the second side surface 102b.

A similar external electrode, which is not shown in FIG. 4, extends on the first side surface 102a. The external electrode extending on the first side surface 102a is electrically connected to the second internal electrodes 107. Therefore, the active section is driven by applying a voltage between the external electrode 117 and the external electrode on the first side surface 102a such that the monolithic actuator is operated.

In the inert sections 104 and 105, the dummy internal electrodes disposed between the ceramic layers are not supplied with a voltage. Thus, the inert sections 104 and 105 do not function as actuators.

A conventional monolithic piezoelectric actuator having a configuration in which inert sections are located on both sides of an active section has a problem in that a sintered body is cracked and/or the inert sections are separated from the active section because of the difference in sintering behavior between the active section and the inert sections. On the other hand, in the piezoelectric actuator 101 disclosed in Patent Document 1, the dummy internal electrodes 111 to 113 and 114 to 116 included in the inert sections 104 and 105 are arranged at the same levels and are separated from each other. Thus, the sintered body is prevented from being cracked and/or the active section 103 is prevented from being separated from the inert sections 104 and 105 due to the difference in sintering behavior therebetween.

In the piezoelectric actuator 101, it is necessary to reduce the influence of a support structure on distortion. In this case, the inert sections 104 and 105 usually have a large size in the thickness direction such that the active section 103, which is distortable, is spaced from a support section for mechanically supporting the piezoelectric actuator 101 at a large distance. This causes the ceramic sintered body 102 to have a large thickness. If the number of the internal electrodes included in the active section 103 for driving the piezoelectric actuator is increased such that a large distortion is created, the ceramic sintered body 102 has a large thickness.

When the ceramic sintered body 102 has a large thickness, the ceramic sintered body 102 prepared by an electrode-ceramic co-firing process the thickness of the ceramic sintered body 102 is not uniform.

In applications in which monolithic piezoelectric actuators are used, in electronic device applications in particular, the size of the piezoelectric actuators must be strictly controlled.

Therefore, when the thickness of the ceramic sintered body 102 is not uniform, the upper surface 102c and lower surface 102d of the ceramic sintered body 102 must be ground such that the ceramic sintered body 102 has a uniform thickness. If the size of portions that are ground as described above is large, the dummy internal electrodes 111 to 113 and 114 to 116 may be exposed at the ground surfaces. This possibility increases with a reduction in the distance between the dummy internal electrodes, that is, a reduction in the thickness of the stacked piezoelectric ceramic layers. The exposure of the dummy internal electrodes 111 to 113 or 114 to 116 at the upper surface and lower surface of the ceramic sintered body 102 may cause mounting defects if the piezoelectric actuator 101 is mounted on a printed circuit board. The piezoelectric actuator 101 having the exposed dummy internal electrodes 111 to 113 or 114 to 116 is a defective product, and therefore, must be eliminated. This reduces the yield.

SUMMARY OF THE INVENTION

To overcome the problems described above, preferred embodiments of the present invention provide a piezoelectric actuator in which inert sections are each disposed on at least one side of an active section in the thickness direction. In the piezoelectric actuator, chipping and/or separation from the inert section during firing caused by differences in shrinkage are prevented. Furthermore, dummy internal electrodes are not exposed by grinding performed to adjust the thickness of the sintered body.

A preferred embodiment of the present invention provides a method for manufacturing a piezoelectric actuator including a ceramic sintered body formed by co-firing internal electrodes and a piezoelectric ceramic. The method includes a step of preparing the ceramic sintered body including an active section and inert sections. The active section includes piezoelectric ceramic layers and the internal electrodes each disposed therebetween and being distorted during operation. The direction along the thickness of the piezoelectric ceramic layer is defined as a thickness direction. The inert sections are each disposed on at least one side of the active section in the thickness direction, include piezoelectric ceramic layers and dummy internal electrodes arranged in the thickness direction, and are not distorted during operation. The dummy internal electrodes are each disposed between the piezoelectric ceramic layers. The thickness of the piezoelectric ceramic layers disposed between the dummy internal electrodes increases with the distance from the active section. The thickness of the outermost piezoelectric ceramic layers located outside the respective outermost dummy internal electrodes in the thickness direction is greater than that of the piezoelectric ceramic layers disposed between the dummy internal electrodes. The method also includes a step of adjusting the size of the ceramic sintered body in the thickness direction by grinding the outermost piezoelectric ceramic layers in the thickness direction.

In the method for manufacturing a piezoelectric actuator, the distance between a surface of each outermost inert section in the thickness direction and the dummy internal electrode of the outermost inert section in the thickness direction is adjusted to at least about 0.5% of the size of the piezoelectric actuator in the thickness direction in the adjusting step.

In the method for manufacturing a piezoelectric actuator, the active section and the inert sections are preferably made of the same ceramic material.

The method for manufacturing a piezoelectric actuator preferably further includes a step of forming a first and a second external electrode for driving the active section on respective outer surfaces of the ceramic sintered body, the first and second external electrodes being electrically connected to some of the internal electrodes included in the active section.

A piezoelectric actuator obtained by the method for manufacturing a piezoelectric actuator according to preferred embodiments of the present invention includes an active section, which is distorted during operation, including piezoelectric ceramic layers and internal electrodes each disposed therebetween and also includes inert sections including piezoelectric ceramic layers and dummy internal electrodes arranged in the thickness direction, the inert sections not being distorted during operation, the direction along the thickness of the piezoelectric ceramic layer being defined as a thickness direction, the inert sections being disposed on at least one side of the active section in the thickness direction, the dummy internal electrodes being disposed between the piezoelectric ceramic layers. The thickness of the piezoelectric ceramic layers disposed between the dummy internal electrodes increases with distance from the active section.

The piezoelectric actuator preferably further includes first and second external electrodes. The ceramic sintered body has first and second side surfaces, opposed to each other, extending in the thickness direction. The internal electrodes included in the active section alternately extend to the first and second side surfaces in the thickness direction of the piezoelectric ceramic layers. The internal electrodes included in the inert sections extend to one of the first and second side surfaces. The first and second external electrodes are disposed on the first and second side surfaces, respectively.

In the method for manufacturing a piezoelectric actuator according to a preferred embodiment of the present invention, the inert sections are disposed on at least one side of the active section including the piezoelectric ceramic layers and internal electrodes alternately arranged in the thickness direction. The inert sections each has a configuration in which the dummy internal electrodes and the piezoelectric ceramic layers are alternately arranged. The thickness of the piezoelectric ceramic layers each disposed between the dummy internal electrodes increases with distance from the active section. Therefore, although the active section is different in shrinkage from the inert sections, the sintered body including the active section and the inert sections is prevented from being chipped and/or the active section is prevented from being separated from the inert sections when the sintered body is prepared by an electrode-ceramic co-firing process. This is because the thickness of the piezoelectric ceramic layers disposed between the dummy internal electrodes increases with distance from the active section and therefore, the strain caused by the difference in shrinkage therebetween is reduced.

The thickness of the piezoelectric ceramic layers disposed between the dummy internal electrodes increases with distance from the active section and the thickness of the outermost piezoelectric ceramic layers located outside the respective outermost dummy internal electrodes in the thickness direction is greater than that of the piezoelectric ceramic layers disposed between the dummy internal electrodes. Therefore, even if the outermost piezoelectric ceramic layers are ground such that the thickness of the sintered body is adjusted, the dummy internal electrodes are not exposed.

Therefore, the occurrence of defects due to the exposure of the dummy internal electrodes is prevented. This results in an increase in yield.

If the distance between a surface of each outermost inert section in the thickness direction and the dummy internal electrode of the outermost inert section in the thickness direction is adjusted to at least about 0.5% of the size of the piezoelectric actuator in the thickness direction in the adjusting step, the possibility that the dummy internal electrodes are partially exposed by grinding is greatly reduced. The upper limit of the size thereof in the thickness direction is not particularly limited. In order to reduce the possibility that the dummy internal electrodes are exposed, the size thereof in the thickness direction is preferably large. However, when it is preferable that the size of the piezoelectric actuator in the thickness direction is not excessively large, the distance therebetween is preferably adjusted to about 2.0% or less of the piezoelectric actuator size in the thickness direction.

If the ceramic sintered body is prepared by an electrode-ceramic co-firing process and therefore is monolithic, the ceramic sintered body is effectively prevented from being cracked or chipped due to difference in shrinkage during co-firing. Thus, preferred embodiments of the present invention are preferably used.

When the method further includes the step of forming the first and second external electrodes electrically connected to some of the internal electrodes included in the active section, the piezoelectric actuator including the first and second external electrodes is obtained. Thus, the piezoelectric actuator is readily driven with the first and second external electrodes.

The piezoelectric actuator according to preferred embodiments of the present invention is obtained by the method according to preferred embodiments of the present invention. Therefore, after the ceramic sintered body including the active section and the inert sections are prepared, the thickness of the ceramic sintered body is adjusted by grinding the piezoelectric ceramic layers outside the dummy internal electrodes located outermost in the thickness direction of the ceramic sintered body. Since the thickness of the outermost piezoelectric ceramic layers in the thickness direction is greater than that of the piezoelectric ceramic layers inside the dummy internal electrodes located outermost in the thickness direction, the dummy internal electrodes are not exposed even if the outermost piezoelectric ceramic layers are ground to a large extent. Furthermore, since the thickness of the piezoelectric ceramic layers between the dummy internal electrodes increases with distance from the active section, the distortion due to the difference in shrinkage is small. Thus, the piezoelectric actuator, in which the ceramic sintered body is not chipped or interfacial peeling does not occur, is provided.

In the piezoelectric actuator according to preferred embodiments of the present invention, when the first and second external electrodes are disposed on the first and second side surfaces, respectively, of the ceramic sintered body, the piezoelectric actuator can be readily used instead of a conventional piezoelectric actuator including a first and a second external electrode disposed on a pair of side surfaces.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described in detail with reference to the accompanying drawings.

Figure 1:
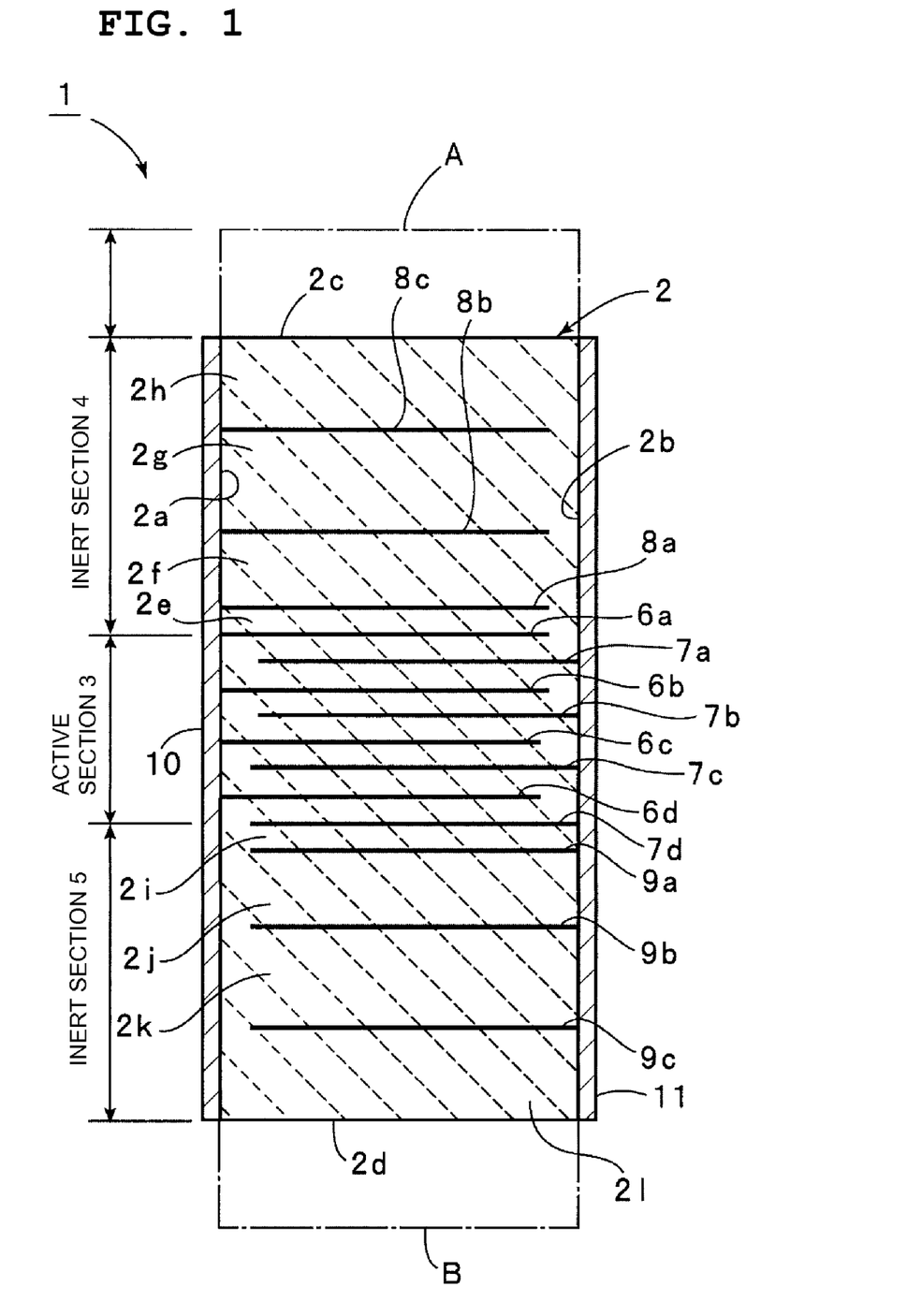
FIG. 1 is a front sectional view of a piezoelectric actuator according to a preferred embodiment of the present invention.

FIG. 1 is a front sectional view of a piezoelectric actuator according to a preferred embodiment of the present invention.

The piezoelectric actuator 1 includes a ceramic sintered body 2. The ceramic sintered body 2 is prepared by an electrode-ceramic co-firing process and therefore is monolithic. In this preferred embodiment, the direction along the thickness of each piezoelectric ceramic layer disposed between internal electrodes is defined as a thickness direction. The ceramic sintered body 2 shown in FIG. 1 is prepared such that a ceramic sintered body of which the size in the thickness direction is greater than the vertical size of the ceramic sintered body 2 is prepared and then ground. In particular, this ceramic sintered body has a size in the thickness direction such that this ceramic sintered body extends between positions indicated by dotted-chain line A or B. Both end portions of this ceramic sintered body that are spaced from each other in the thickness direction are ground such that ceramic layer portions indicated by dotted-chain line A or B are removed, whereby the ceramic sintered body 2 is obtained.

Figure 2:
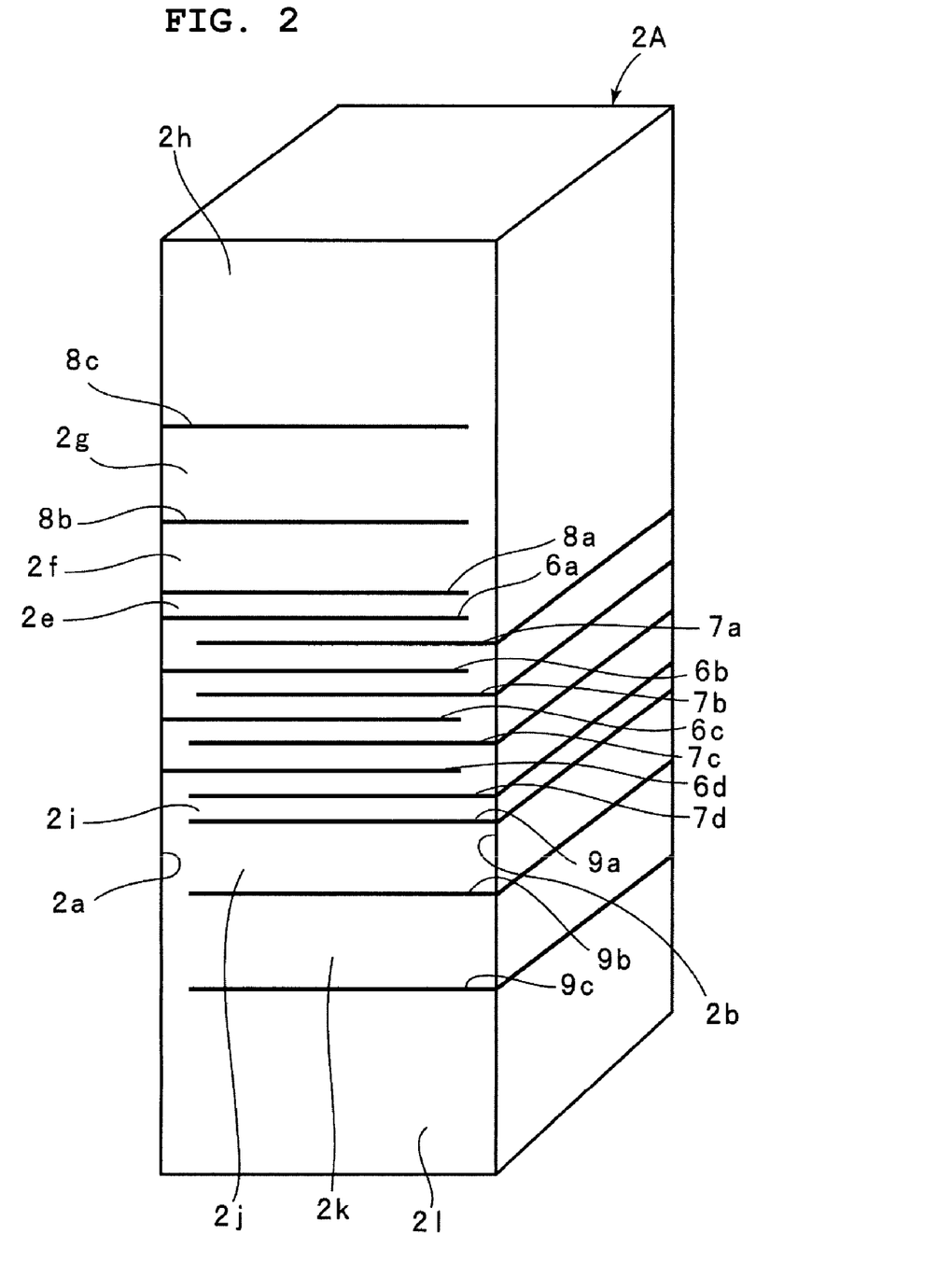
FIG. 2 is a perspective view of a ceramic sintered body prepared for manufacturing the piezoelectric actuator shown in FIG. 1.

FIG. 2 is a perspective view of that ceramic sintered body 2A which has not yet been ground.

On the other hand, with reference to FIG. 1, an active section 3 is located at the approximate center of the ceramic sintered body 2 extending in the thickness direction. Inert sections 4 and 5 are located on both sides of the ceramic sintered body 2 that are spaced from each other in the thickness direction. In the present invention, the inert sections may be each located on one side of the ceramic sintered body.

The active section 3 includes first internal electrodes 6a to 6d, second internal electrodes 7a to 7d, and ceramic layers, the first and second internal electrodes 6a to 6d and 7a to 7d being alternately arranged in the thickness direction with the ceramic layers disposed therebetween.

The ceramic sintered body 2 has a first side surface 2a and the first internal electrodes 6a to 6d extend to the first side surface 2a. The ceramic sintered body 2 has a second side surface 2b opposed to the first side surface 2a and the second internal electrodes 7a to 7d extend to the second side surface 2b.

In the ceramic sintered body 2, since the first and second internal electrodes 6a to 6d and 7a to 7d are alternately arranged with the ceramic layers disposed therebetween and the ceramic layers are polarized in the thickness direction, the active section 3 is expanded or contracted in the thickness direction by applying electric fields between the first and second internal electrodes 6a to 6d and 7a to 7d, whereby the piezoelectric actuator is operated.

The inert section 4 includes ceramic layers and dummy internal electrodes 8a to 8c extending to the first side surface 2a, the dummy internal electrodes 8a to 8c and these ceramic layers being alternately arranged. All of the dummy internal electrodes 8a to 8c extend to the first side surface 2a but do not extend to the second side surface 2b.

The inert section 5 includes dummy internal electrodes 9a to 9c and ceramic layers, the dummy internal electrodes 9a to 9c and the ceramic layers being alternately arranged. The dummy internal electrodes 8a to 8c extend to the second side surface 2b but do not extend to the first side surface 2a.

A first external electrode 10 and a second external electrode 11 extend over the side surfaces 2a and 2b, respectively. The first external electrode 10 is electrically connected to the dummy internal electrodes 8a to 8c included in the inert section 4 and the first internal electrodes 6a to 6d included in the active section 3. The second external electrode 11 is electrically connected to the second internal electrodes 7a to 7d included in the active section 3 and the dummy internal electrodes 9a to 9c included in the inert section 5.

The internal electrode 6a of the active section 3 is located between the active section 3 and the inert section 4. The internal electrode 6a located closest to the inert section 4 and the dummy internal electrode 8a located closest to the active section 3 are connected to the external electrode 10 and therefore are maintained at the same potential. Thus, no electric field is applied to the ceramic layer 2e disposed between the internal electrode 6a and the dummy internal electrode 8a.

The ceramic layer 2e preferably has substantially the same thickness as that of the ceramic layers sandwiched between the internal electrodes 6a to 6d and 7a to 7d adjacent to each other. The dummy internal electrode 9a, included in the inert section 5, located closest to the active section 3 and the second internal electrode 7d, included in the active section 3, located closest to the inert section 5 are connected to the external electrode 11 and therefore are maintained at the same potential. Thus, no electric field is applied to the ceramic layer 2i disposed between the internal electrode 7d and the dummy internal electrode 9a during operation.

The ceramic sintered body 2 may include an appropriate piezoelectric ceramic material, such as lead titanate zirconate or lead titanate. The internal electrodes 6a to 6d and 7a to 7d, the dummy internal electrodes 8a to 8c and 9a to 9c, and the external electrodes 10 and 11 may include an appropriate conductive material such as Ag or Cu. In this preferred embodiment, the internal electrodes 6a to 6d and 7a to 7d and the dummy internal electrodes 8a to 8c and 9a to 9c are formed by a printing process using an Ag/Pd paste. The external electrodes 10 and 11 include Ag.

In order to manufacture the piezoelectric actuator 1 of this preferred embodiment, the ceramic sintered body 2A shown in FIG. 2 is prepared. When the thickness of the ceramic sintered body 2A is greater than a predetermined value, both ends of the ceramic sintered body 2A, that is, the upper and lower surfaces thereof are ground such that the ceramic sintered body 2A has a predetermined thickness, whereby the ceramic sintered body 2A is obtained. The external electrodes 10 and 11 are then formed on the side surfaces 2a and 2b, respectively, of the ceramic sintered body 2.

The thickness of the piezoelectric ceramic layers 2e to 2g and 2i to 2k sandwiched between the dummy internal electrodes 8a to 8c and 9a to 9c, respectively, increases with distance from the active section 3. For example, the thickness of the internal electrode layer 2f sandwiched between the dummy internal electrodes 8a and 8b is greater than that of the dummy internal electrode 2e.

As shown in FIG. 2, the thickness of the piezoelectric ceramic layers 2e to 2g sandwiched between the dummy internal electrodes 8a to 8c included in the inert section 4 increases with distance from the active section 3. Before the ceramic sintered body 2A prepared as described above is ground, the outermost ceramic layer 2h outside the outermost dummy internal electrode 8c has a thickness greater than that of the piezoelectric ceramic layer 2g.

Before the ceramic sintered body 2A is ground, the outer piezoelectric ceramic layers included in the inert section 4 have an increased thickness. Therefore, even if the ceramic sintered body 2A is ground such that the thickness is adjusted, that is, even if a region surrounded by dotted-chain line A in FIG. 1 is removed by grinding, the outermost dummy internal electrode 8c is not exposed.

In the inert section 5, the thickness of the piezoelectric ceramic layers 2i to 2k sandwiched between the dummy internal electrodes 9a to 9c increases with distance from the active section 3. Before the ceramic sintered body 2A is ground, the outermost piezoelectric ceramic layer 21 located outside the outermost dummy internal electrode 9c has a thickness greater than that of the piezoelectric ceramic layer 2k. Therefore, even if grinding is performed as described above, the outermost dummy internal electrode 9c is not exposed.

In the piezoelectric actuator 1 of this preferred embodiment, even if the thickness is adjusted by grinding, the outermost dummy internal electrodes 8c and 9c are not exposed. This leads to a reduction in the number of defective products, resulting in an increased yield.

Among the piezoelectric ceramic layers included in the inert sections 4 and 5, the piezoelectric ceramic layers 2e and 2i located closest to the active section 3 have substantially the same thickness as that of the piezoelectric ceramic layers disposed between the internal electrodes 6a to 6d and 7a to 7d. Thus, the shrinkage behavior of portions of the inert sections 4 and 5 is similar to the shrinkage behavior of the active section 3 during firing. This prevents the sintered body from being cracked or chipped due to the difference in shrinkage between the active section 3 and the inert sections 4 and 5.

The fact that defects or cracks are prevented from occurring in this preferred embodiment will now be described in detail on the basis of an experiment.

The following sheets were prepared: first green piezoelectric ceramic sheets, including a PZT ceramic, having respective internal electrode patterns formed by printing using an Ag/Pd paste for forming the internal electrodes 6a to 6d and 7a to 7d. Furthermore, the following sheets were prepared: green second piezoelectric ceramic sheets, primarily including an Ag/Pd ceramic, having respective internal electrode patterns, formed by printing, corresponding to the dummy internal electrodes 8a to 8c and 9a to 9c. The following sheets were prepared: green third piezoelectric ceramic sheets having no internal electrode patterns.

The green first to third piezoelectric ceramic sheets were stacked such that the active section 3 and the inert sections 4 and 5 were formed. The stacked sheets were pressed in the thickness direction of the sheets, whereby a compact was prepared. The compact obtained as described above was fired at about 1050° C., whereby the ceramic sintered body 2A that was long in the direction in which the sheets were stacked was obtained. The ceramic sintered body 2A had a thickness of about 33 mm, that is, in the direction in which the sheets were stacked and also had a cross-sectional profile which was about 9 mm square, and which was substantially perpendicular to the thickness direction. The distance between the upper or lower surface of the ceramic sintered body 2A, that is, one of end portions of the ceramic sintered body 2A that were spaced from each other in the thickness direction, and the outermost dummy internal electrode located closest to the end portion was about 1.0 mm. Side surfaces 2a, 2b, 2c, and 2d of the ceramic sintered body 2A were ground with a surface grinder such that the side surfaces 2a, 2b, 2c, and 2d had a size of about 8.6 mm×about 8.6 mm. The upper and lower surfaces of the ceramic sintered body 2A, that is, both ends of the ceramic sintered body 2A that were spaced from each other in the thickness direction were finished such that the ceramic sintered body 2A had a thickness of about 32 mm. The external electrodes 10 and 11 including Ag were then formed on the side surfaces 2a and 2b, respectively, whereby the piezoelectric actuator 1 was obtained. The grinding allowance of each end portion ground in the thickness direction was about 0.5 mm.

Although the grinding allowance thereof was about 0.5 mm and the finished ceramic sintered body 2A had a thickness of about 32 mm as described above, the outermost dummy internal electrodes 8c and 9c were not exposed. This demonstrates that defects caused by the outermost dummy internal electrodes are prevented.

Typically, in the piezoelectric actuator 1, the external electrodes 10 and 11 are electrically connected to lead wires on the inert sections 4 and 5. In order to connect the external electrodes 10 and 11 to the lead wires by soldering, the external electrodes 10 and 11 extending on the inert sections 4 and 5 must have a size of about 0.5 mm in the thickness direction. If the piezoelectric ceramic layers between the dummy internal electrodes 8a to 8c and 9a to 9c have the same thickness, the number of dummy internal electrodes connected to the lead wires will be large and therefore manufacturing cost will be high. In contrast, in this preferred embodiment, the thickness of the ceramic layers between the dummy internal electrodes increases with distance from the active section 3. Although the external electrodes 10 and 11 have a thickness of about 0.5 mm, the number of dummy internal electrodes is small. This reduces the manufacturing cost.

Figure 3:
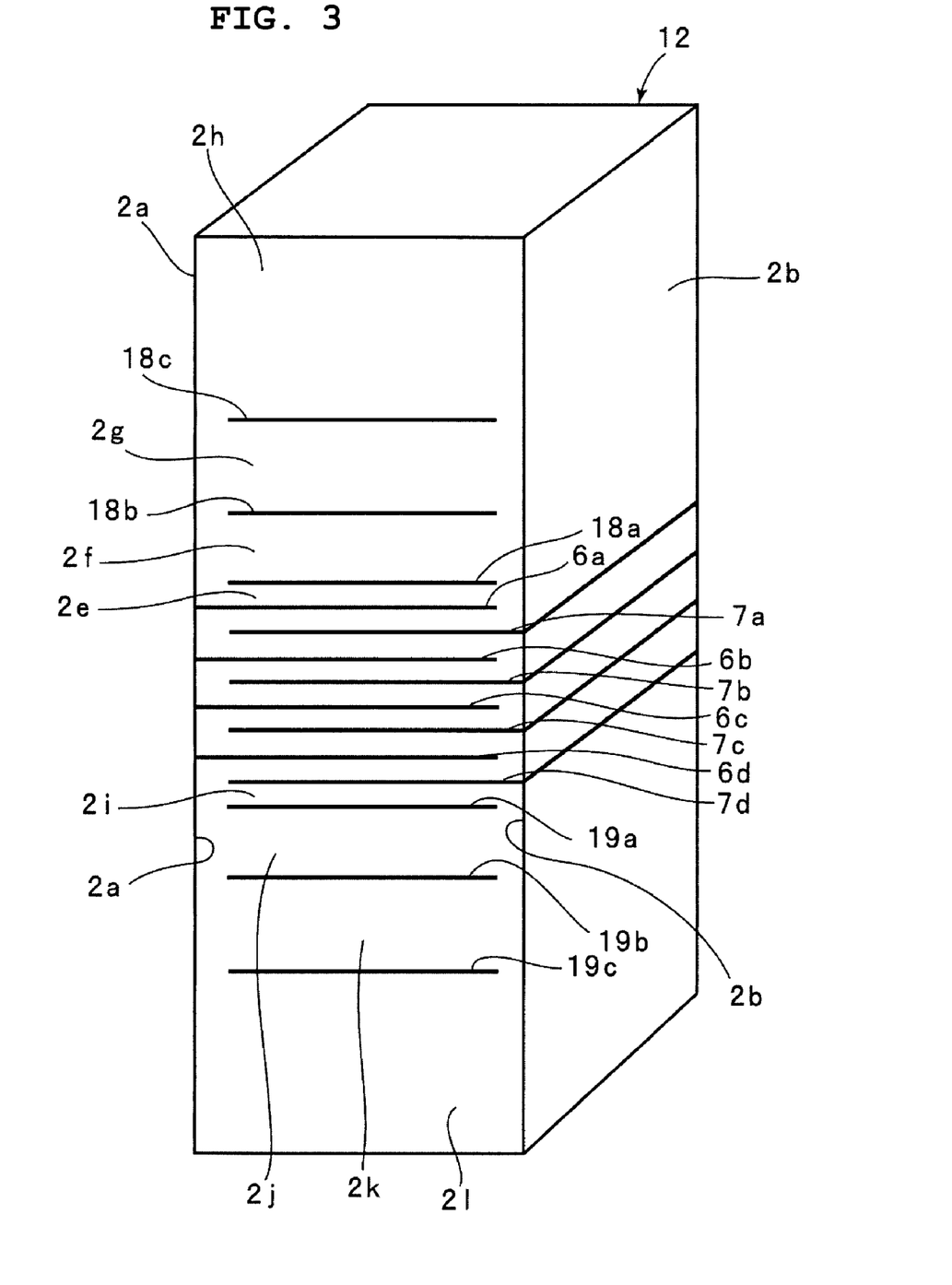
FIG. 3 is a perspective view of a modification of a ceramic sintered body included in a piezoelectric actuator according to a preferred embodiment of the present invention.

In the above preferred embodiment, the dummy internal electrodes 8a to 8c and 9a to 9c extend to the side surfaces 2a and 2b, respectively, such that the dummy internal electrodes 8a to 8c and 9a to 9c are connected to the external electrodes 10 and 11, respectively. In another preferred embodiment, dummy internal electrodes need not extend to side surfaces on which external electrodes are formed. FIG. 3 shows a ceramic sintered body 12 which is a modification. As shown in FIG. 3, dummy internal electrodes 18a to 18c and 19a to 19c do not extend to side surfaces on which external electrodes are to be formed and may be a non-contact type.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric actuator comprising:
    a ceramic sintered body comprising:
        an active section having a structure that is distorted during operation of the piezoelectric actuator and including piezoelectric ceramic layers and internal electrodes each disposed between adjacent ones of the piezoelectric ceramic layers included in the active section; and
        inert sections including piezoelectric ceramic layers and dummy internal electrodes arranged in a thickness direction, the inert sections having a structure that is not being distorted during operation of the piezoelectric actuator, the thickness direction being defined by a direction along the thickness of the piezoelectric ceramic layers included in the inert sections, each of the inert sections being disposed on at least one side of the active section in the thickness direction, each of the dummy internal electrodes being disposed between adjacent ones of the piezoelectric ceramic layers included in the inert sections; wherein
    a thickness of the piezoelectric ceramic layers included in the inert sections increases with increasing distance from the active section.

2. The piezoelectric actuator according to claim 1, further comprising:
    first and second external electrodes; wherein
    the ceramic sintered body includes a first side surface and a second side surface, opposed to each other, extending in the thickness direction, and the first and second external electrodes are disposed on the first and second side surfaces of the ceramic sintered body, respectively;
    the internal electrodes included in the active section alternately extend to the first and second side surfaces in the thickness direction of the piezoelectric ceramic layers; and
    the dummy internal electrodes included in the inert sections extend to one of the first and second side surfaces of the ceramic sintered body.

3. The piezoelectric actuator according to claim 1, wherein a distance between a surface of each of the inert sections that is located outermost in the thickness direction and the dummy internal electrode of the inert section that is located outermost in the thickness direction is at least about 0.5% of the thickness of the piezoelectric actuator.

4. The piezoelectric actuator according to claim 1, wherein the active section and the inert sections are made of the same ceramic material.

5. The piezoelectric actuator according to claim 1, wherein the piezoelectric ceramic layers included in the active section include PZT ceramic.

6. The piezoelectric actuator according to claim 1, wherein the piezoelectric ceramic layers included in the inert sections include PZT ceramic.

7. The piezoelectric actuator according to claim 1, wherein the internal electrodes are made of an Ag/Pd paste.

8. The piezoelectric actuator according to claim 1, wherein a thickness of the outermost dummy internal electrodes in the thickness direction is greater than that of the piezoelectric ceramic layers disposed between the dummy internal electrodes in the inert sections.

* * * * *